US006917256B2

(12) United States Patent
Emrick et al.

(10) Patent No.: US 6,917,256 B2
(45) Date of Patent: Jul. 12, 2005

(54) LOW LOSS WAVEGUIDE LAUNCH

(75) Inventors: Rudy Michael Emrick, Gilbert, AZ (US); Richard Dennis Heidinger, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/224,252

(22) Filed: Aug. 20, 2002

(65) Prior Publication Data

US 2004/0036550 A1 Feb. 26, 2004

(51) Int. Cl.7 .............................. H03H 5/00; H01P 1/00

(52) U.S. Cl. .......................................... 333/26; 333/248

(58) Field of Search .......................... 333/26, 246, 248, 333/33, 161; 343/705, 767; 257/728; 330/66; 435/119

(56) References Cited

U.S. PATENT DOCUMENTS 4,870,375 A * 9/1989 Krueger et al. ............... 333/33
4,901,040 A * 2/1990 Ahlborn et al. ............... 333/26
5,539,361 A * 7/1996 Davidovitz .................. 333/26
5,724,049 A * 3/1998 Park et al. .................. 343/705
5,726,664 A * 3/1998 Park et al. .................. 343/705
5,912,598 A * 6/1999 Stones et al. ................. 333/26
5,982,250 A * 11/1999 Hung et al. .................... 333/26
6,002,305 A * 12/1999 Sanford et al. ............... 333/26
6,040,739 A * 3/2000 Wedeen et al. ............... 330/66
6,333,683 B1 * 12/2001 Hampel ....................... 333/161
6,353,416 B1 * 3/2002 Hopkins et al. ............ 343/767
6,396,363 B1 * 5/2002 Alexanian et al. ............ 333/26
6,486,748 B1 * 11/2002 Stones et al. ................. 333/26
6,501,431 B1 * 12/2002 Irion et al. .................. 343/767
6,512,431 B2 * 1/2003 Pergande .................... 333/246
6,549,106 B2 * 4/2003 Martin ....................... 333/248
6,573,803 B1 * 6/2003 Ziegner et al. ............... 333/26
6,624,716 B2 * 9/2003 Goff ............................ 333/26
6,667,549 B2 * 12/2003 Cahill ........................ 257/728
6,707,348 B2 * 3/2004 Ammar ....................... 333/26

* cited by examiner

*Primary Examiner*—Patrick Wamsley

(57) ABSTRACT

According to the preferred exemplary embodiments of the present invention, a transmission line, such as microstrip, is connected to a waveguide using suspended stripline as an intermediate connection. This method results is a very low-loss transition, suitable for active microwave device applications such as low-noise receivers and transmitting devices such as power amplifiers.

29 Claims, 1 Drawing Sheet

LOW LOSS WAVEGUIDE LAUNCH

TECHNICAL FIELD

The present invention relates generally to the field of microwave or millimeter wave energy transmission and more particularly relates to the physical coupling of a transmission line to a waveguide.

BACKGROUND OF THE INVENTION

The demand for Monolithic Microwave Integrated Circuit (MMIC) devices has increased dramatically over the past few years. This increase is due largely to the frequent utilization of MMIC devices in radar systems, electronic warfare devices, missiles and array weapons as well as a wide variety of non-military communications applications. In most cases, there are a number of microwave or millimeter wave components involved, including MMICs, diodes, printed circuits, antennas, and certain waveguide components such waveguide power combiners or waveguide antenna feeds.

These "mixed microwave circuits," are those in which part of the circuit is in the form of conductively bounded hollow circular or rectangular guides (waveguides), and part of the circuit is in the form of the well known conductor strip sandwiched between parallel dielectric slabs (stripline) or the equally well known conductor strip mounted on a dielectric slab (microstrip). Most of the components utilized for microstrip/stripline transmission lines are typically mounted on planar microstrip transmission line circuits since this method provides manufacturing efficiencies at a relatively low cost.

As the frequency of operation for a given circuit increases, the use of waveguide elements becomes increasingly desirable because of the inherent low loss characteristics associated with waveguide transmission. However, while generally more desirable, waveguide transmission is typically more expensive to implement than microstrip/stripline transmission lines. In addition, since MMICs cannot be mounted directly into a typical waveguide structure, it is generally necessary to transition one or more times between transmission lines of these different types. These commonly implemented transitions between microstrip/stripline and waveguide have also been an issue for certain applications.

However, as the monolithic circuitry in these devices becomes increasingly dense, and as operating frequencies for commercial applications become increasingly popular for broadband applications at K-Band frequencies (18 GHz) through W-band frequencies (94 GHz) and beyond, to include millimeter and sub-millimeter wave ranges, minimizing signal loss becomes an increasingly important consideration. This places a growing burden on existing millimeter wave manufacturing technologies, and especially on radio frequency (RF) input/output transitions, which are often the source of signal capture loss.

The various transition techniques used for channeling high frequency signals in many double-sided or multilayer circuit boards that are connected to a waveguide, typically requires a probe to pass through both the waveguide wall and the circuit board so that when the probe protrudes into the waveguide, it will pick up the signals propagating within the waveguide. In order for such an arrangement to work properly, it is common practice to connect the probe to a microstrip conductor. This is typically accomplished by having the microstrip line on the printed circuit board extend into the side of the waveguide to form an E-plane launch. However, with this arrangement, the transition to the waveguide is often quite "lossy," and may result in more than 1 dB of loss. Additionally, this arrangement may require hand tuning, using a tuning screw that protrudes into the waveguide, or by other means well know to those skilled in the art. These commonly used practices for assembling and tuning transitions can be quite expensive because of the time and labor associated with assembly and tuning.

Finally, the losses associated with these transitions, which are a combination of both dissipative and impedance mismatch loss, are unacceptable for many applications such as low-noise receivers and certain classes of power amplifiers. Additionally, dissipative and impedance mismatch losses may also result in further degradation or actual loss of signal. Well know methods for tuning, to reduce impedance mismatch losses and improve performance, can increase the cost of devices incorporating these transitions to unacceptable levels for many commercial applications.

In view of the foregoing, it should be appreciated that there is still a need for an efficient, cost effective method and apparatus for coupling microwave or millimeter wave frequency range energy from a microstrip transmission line to a waveguide transmission line. Furthermore, other desirable features and characteristics of the present invention will become apparent from the subsequent description and the appended claims, taken in conjunction with the accompanying drawings.

BRIEF DESCRIPTION OF THE DRAWINGS

The present invention will hereinafter be described in conjunction with the appended drawing figures, wherein like numerals denote like elements, and.

DETAILED DESCRIPTION OF THE DRAWINGS

Figure 1:
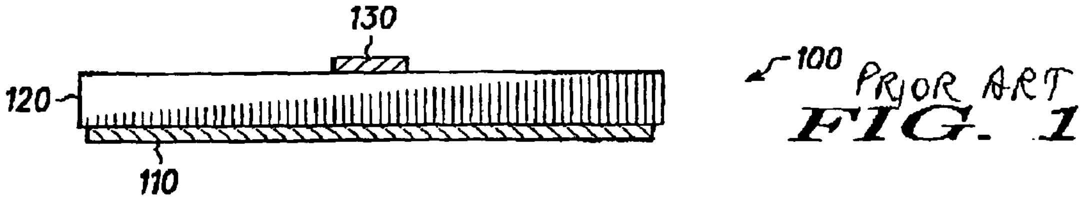
FIG. 1 is a sectional view of a microstrip transmission line suitable for use in a preferred exemplary embodiment of the present invention.

Referring now to FIG. 1, a microstrip 100 suitable for use with a preferred exemplary embodiment of the present invention is shown. As shown in FIG. 1 microstrip 100 comprises a groundplane 110; a dielectric slab 120; and a conductor strip 130. In the preferred exemplary embodiments of the present invention, dielectric slab 120 is preferably a low loss dielectric material such as Teflon®, Duroid® or any other suitable substrate known to those skilled in the art. Conductor strip 130 may be fabricated from any type of conductive material suitable for transmitting signals in a microwave circuit but is most preferably a highly conductive gold or copper alloy. Microstrip 100 is well known to those skilled in the art and represents a very popular type of planar transmission line, primarily because it can be fabricated by standard photolithographic processes and is easily integrated with other passive and active microwave devices.

Figure 2:
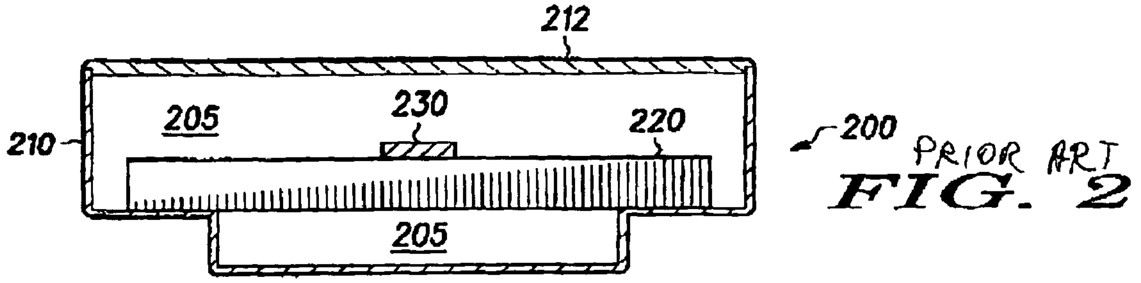
FIG. 2 is a sectional view of a suspended stripline suit suitable for use in a preferred exemplary embodiment of the present invention.

Referring now to FIG. 2, a suspended stripline 200 suitable for use with a preferred exemplary embodiment of the present invention is shown. As shown in FIG. 2, suspended stripline 200 comprises a groundplane 210, a dielectric slab 220, and a conductor strip 230. Conductor strip 230 and dielectric slab 220 are surrounded by a dielectric 205 and encased within groundplane 210. In the most preferred embodiments of the present invention, dielectric 205 is air. Similar to microstrip 100, suspended stripline 200 is well known to those skilled in the art. As with microstrip 100, suspended stripline 200 can also be fabricated using standard photolithographic processes and is useful in many different microwave applications.

Groundplane 210 is a conductive housing for conductor strip 230 and dielectric slab 220 and may be fabricated from one or more components. In this embodiment, groundplane 210 includes a conductive lid 212 that is attached to groundplane 210 after conductor strip 230 and dielectric slab 220 have been placed inside groundplane 210. Conductive lid 212 becomes part of groundplane 210 and may be attached using conductive epoxy, solder, or some other suitable means known to those skilled in the art. Dielectric slab 220 may be fixed in place by applying non-conductive epoxy to the edges of dielectric slab 220 where it contacts the interior surface of groundplane 210.

It should be noted that the transition from microstrip 100 to suspended stripline 200 increases the characteristic impedance of the signal line, given a signal line with the same physical dimensions and composition. Accordingly, conductor strip 230 should be relatively wider than conductor strip 130 to lower the impedance at the point of the transition. This is also advantageous because the effective ohmic loss associated with conductor strip 230 will be reduced.

From the point of connection to microstrip 100 to the point of connection to a waveguide, the width of conductor strip 230 can be gradually tapered down towards its terminal end to match the desired impedance for the specific waveguide application. In addition, the dielectric properties of dielectric slab 220 become less significant because suspended stripline is used and the dielectric properties of dielectric 205, typically the air surrounding dielectric slab 220 and conductor strip 230, will enter into the equation as well.

Figure 3:
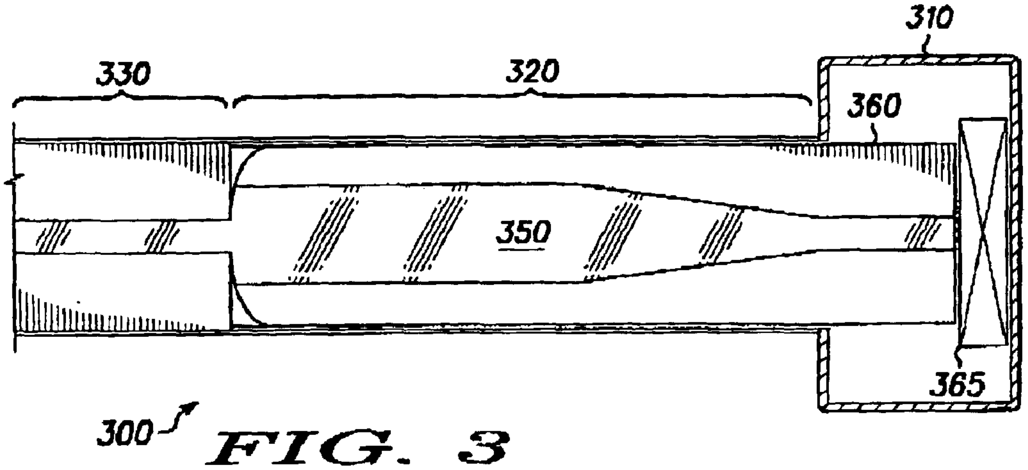
FIG. 3 is a plan view of a low loss waveguide according to a preferred exemplary embodiment of the present invention.

Referring now to FIG. 3, a plan view of a low loss waveguide launch 300 in accordance with a preferred exemplary embodiment of the present invention is shown. As shown in FIG. 3, a low loss waveguide launch 300 comprises a microstrip section 330, a suspended stripline section 320, and a waveguide 310. Microstrip section 330 is connected to suspended stripline section 320, which, in turn, is connected to waveguide 310. Dielectric slab 360 is contiguous beneath both microstrip 330 and suspended stripline 320 and forms the support structure for conductor strip 350. The combination of microstrip section 330 and suspended stripline section 320 form a contiguous transmission line suitable for transmitting microwave signals to waveguide 320. The frequency of the transmitted microwave signals capable of being transmitted by the present invention is not limited to any specific frequency, but the present invention will be particularly useful in applications greater than 1 GHz and will be especially useful in applications where the frequency exceeds 25 GHz.

Dielectric slab 360 and conductor strip 350 extend into waveguide 310, thereby providing an e-plane launch for the signal carried by conductor strip 350 into waveguide 310. This allows the transmission line to be fabricated fairly easily, and at a relatively low cost. Microstrip section 330 is typically connected to some type of active device (not shown this FIG.) and may be used to transmit a signal to and from the active device to waveguide 310. The signal from the active device is transmitted to waveguide 310 by conductor strip 350.

Rectangular waveguide 310 is representative of the type of waveguides typically used to transmit microwave signals and is well known to those skilled in the art. An opening in waveguide 310 is provided to receive dielectric slab 360 and conductor strip 350 into waveguide 310. Additionally, a depth guide 365 is positioned between the end of dielectric slab 360 and the sidewall of waveguide 310 during the assembly process. The use of depth guide 365 allows for controlling the depth of insertion of dielectric slab 360 and conductor strip 350 into waveguide 310. While the use of depth guide 365 is optional, it is considered desirable because the depth of insertion into waveguide 310 can be an important consideration for certain applications. After dielectric slab 360 has been positioned and firmly fixed in place, depth guide 365 may be removed from waveguide 310.

A large variety of components related to waveguides such as couplers, detectors, isolators, attenuators, and slotted lines are commercially available for various standard waveguide bands from 1 GHz to over 30 GHz. Typically, as the frequency increases, the availability of the various components decreases and the cost of the available components increases. This makes the relatively inexpensive approach of the present invention generally more compelling as the transmission frequency increases.

As with conductor strip 230 of FIG. 2, conductor strip 350 is most preferably a highly conductive gold or copper alloy. Additionally, dielectric slab 360 is preferably fabricated from a low loss dielectric material such as Teflon®, Duroid® or any other similar suitable substrate and is typical of the dielectric slabs presently used to fabricate typical multi-chip modules. Suspended stripline 320 and microstrip 330 are formed on the same substrate and the transition point between suspended stripline 320 and microstrip 330 is marked by a step change in the line width of conductor strip 350.

Figure 4:
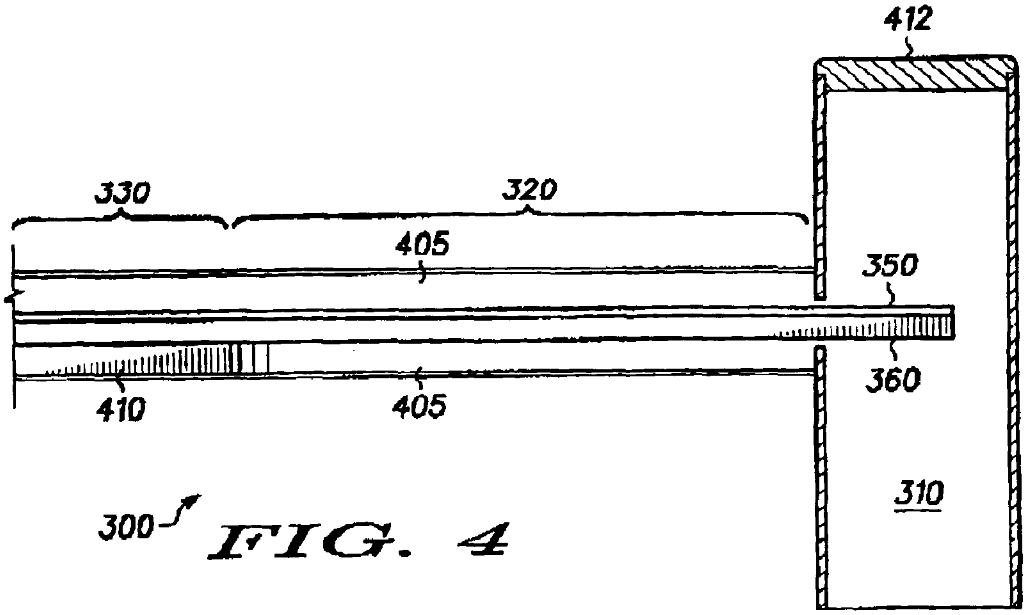
FIG. 4 is a side view of a low loss waveguide according to a preferred exemplary embodiment of the present invention.

Referring now to FIG. 4, a side view of low loss waveguide launch 300 of FIG. 3 is shown. In this view, groundplane 410 is shown beneath microstrip section 330 and dielectric 405 is shown above and below dielectric slab 360 and conductor strip 350. Additionally, a backshort 412 is included in waveguide 310. In the most preferred embodiments of the present invention, dielectric 405 is simply air. Once again, it can be seen that dielectric slab 360 and conductor strip 350 extend into waveguide 310. It should be noted that the physical length of microstrip section 330 and suspended stripline section 320 will be determined by the specific application but, in general, microstrip section 330 will be as short as possible to prevent any undesired losses.

Without tuning, the low loss transition connection between microstrip section 330 and waveguide 310 demonstrates a loss of approximately 1/10 dB at a frequency of 30 GHz. While various tuned microwave transmission waveguide transition components available today can provide similar performance, the cost of such components is significantly higher that the apparatus described herein. While not limited to any specific frequency or range of frequencies, the methods and apparatus described herein are especially useful in frequencies in the range of 25 GHz and above.

Thus, there has been provided a low loss waveguide for use in transitioning a transmission line from a microstrip transmission line to a waveguide. Although the present invention has been illustrated by depicting a microstrip transmission line connected to a waveguide, the low loss waveguide of the present invention provides a relatively inexpensive and easy to fabricate solution for connecting many types of transmission lines to a waveguide. For example, regular, non-suspended stripline may be transitioned to suspended stripline in a manner similar to that shown in FIGS. 3 and 4. Specifically, other embodiments of the present invention may include a co-axial cable to suspended stripline transmission line transition or a co-planar waveguide to suspended stripline transmission line transition. Other similar applications of the present invention will be readily understood by those skilled in the art.

The relatively low loss transition provided by the methods and apparatus of the present invention allows for a potential relaxation in the specifications for active devices commonly used in microwave transmission applications. By providing a lower loss transition, less power is needed from power amplifiers to drive a given signal for a given application. Additionally, it is possible to allow a higher noise calculation figure in a specification for a low noise amplifier, while still achieving the same performance at the module level, resulting in a more efficient power amplifier. Finally, the various thermal considerations for microwave applications requiring a smaller power amplifier are also simplified.

While the preferred exemplary embodiments have been presented in the foregoing detailed description, it should be appreciated that a vast number of variations exist. It should also be appreciated that the preferred embodiments are only examples and are not intended to limit the scope, applicability, or configuration of the invention in any way. Rather, the foregoing detailed description provides those skilled in the art with a convenient roadmap for implementing the preferred exemplary embodiments of the invention. It should be understood that various changes may be made in the function and arrangement of elements described in the exemplary preferred embodiment without departing from the spirit and scope of the invention as set forth in the appended claims.

What is claimed is:

1. A coupling apparatus comprising:

a microstrip transmission line including a first groundplane;

a waveguide; and a suspended stripline coupled between said microstrip transmission line and said waveguide, said suspended stripline at least partially separated from said first groundplane by air.

2. The coupling apparatus of claim 1 wherein said microstrip transmission line comprises:

a substrate mounted on said first groundplane; and a conductor strip mounted on said substrate.

3. The coupling apparatus of claim 2 wherein said substrate comprises a Teflon® substrate.

4. The coupling apparatus of claim 2 wherein said substrate comprises a Duroid® substrate.

5. The coupling apparatus of claim 2 wherein said waveguide further comprises a depth guide inserted during an assembly process.

6. The coupling apparatus of claim 2 wherein said conductor strip comprises a first end having a first width coupled to said microstrip transmission line, and a second end having a second width coupled to said waveguide, said first width being larger than said second width.

7. The coupling apparatus of claim 1 wherein said suspended stripline comprises:

a second groundplane at least partially separated from said suspended stripline by air;

a dielectric slab mounted within said second groundplane; and a conductor strip mounted on said dielectric slab.

8. The coupling apparatus of claim 7 wherein said dielectric slab comprises a Teflon® substrate.

9. The coupling apparatus of claim 7 wherein said dielectric slab comprises a Duroid® substrate.

10. The coupling apparatus of claim 1 wherein said microstrip transmission line transmits a signal to said waveguide via said suspended stripline.

11. The coupling apparatus of claim 10 wherein said signal comprises a microwave signal with a frequency greater than 1 GHz.

12. The coupling apparatus of claim 10 wherein said signal comprises a microwave signal with a frequency greater than 25 GHz.

13. The coupling apparatus of claim 1 wherein said waveguide further comprises:

a backshort; and an opening for receiving at least a portion of said suspended stripline.

14. A low-loss waveguide launch comprising:

a microstrip section, said microstrip section comprising;

- a microstrip groundplane;
- a microstrip substrate mounted on said microstrip groundplane; and
- a microstrip conductor strip mounted on said microstrip substrate;

a suspended stripline section connected to said microstrip transmission line, said suspended stripline section comprising:

- a stripline groundplane;
- a stripline substrate mounted within said stripline groundplane; and
- a stripline conductor strip mounted on said stripline substrate;
- wherein said suspended stripline is at least partially separated from said microstrip groundplane and said stripline groundplane by air;

a waveguide, said waveguide comprising:

- an opening for receiving at least a portion of said stripline; and
- a backshort; and;

wherein said waveguide receives at least a portion of said suspended stripline conductor strip and said stripline substrate through said opening in said waveguide.

15. The waveguide launch of claim 14 wherein said microstrip conductor strip transmits a signal to said waveguide via said stripline conductor strip.

16. The waveguide launch of claim 15 wherein said signal comprises a microwave signal with a frequency from and greater than 1 GHz.

17. The waveguide launch of claim 15 wherein said signal comprises a microwave signal with a frequency greater than 1 GHz.

18. The waveguide launch of claim 15 wherein said signal comprises a microwave signal with a frequency greater than 25 GHz.

19. The waveguide launch of claim 14 wherein said microstrip conductor strip and said stripline conductor strip form a contiguous transmission line.

20. The coupling apparatus of claim 14 wherein said stripline conductor strip comprises a first end having a first width coupled to said microstrip conductor strip, and a second end having a second width coupled to said waveguide, said first width being larger than said second width.

21. A method comprising the steps of:

connecting a microstrip transmission line to a suspended stripline, said suspended stripline at least partially surrounded by air;

connecting said suspended stripline to a waveguide; and transmitting a signal from said microstrip transmission line to said waveguide via said suspended stripline.

22. The method of claim 21 wherein said suspended stripline comprises a groundplane;

a dielectric slab mounted within said groundplane; and a conductor strip mounted on said dielectric slab and at least partially separated from said groundplane by said air.

23. The coupling apparatus of claim 22 wherein said conductor strip comprises a first end having a first width coupled to said microstrip transmission line, end a second end having a second width coupled to said waveguide, said first width being larger than said second width.

24. The method of claim 21 further comprising the step of positioning at least a portion of said suspended stripline within said waveguide using a depth guide.

25. The method of claim 21 wherein said step of transmitting a signal comprises the step of transmitting a microwave signal with a frequency from and greater than 1 GHz.

26. The method of claim 21 wherein said step of transmitting a signal comprises the step of transmitting a microwave signal with a frequency greater than 1 GHz.

27. The method of claim 21 wherein said step of transmitting a signal comprises the step of transmitting a microwave signal with a frequency greater than 25 GHz.

28. The method of claim 21 wherein said microstrip transmission line comprises:

a groundplane;

a substrate mounted on said groundplane; and a conductor strip mounted on said substrate.

29. The method of claim 21 wherein said waveguide further comprises;

an opening for receiving at least a portion of said suspended stripline; and a backshort.

* * * * *